United States Patent [19]

Hargreaves

[11] Patent Number: 4,799,892

[45] Date of Patent: Jan. 24, 1989

[54] METHOD AND APPARATUS FOR REMOVABLY ATTACHING SEMICONDUCTOR PACKAGES TO CIRCUIT BOARDS

[75] Inventor: William P. Hargreaves, Beaverton, Oreg.

[73] Assignee: TriQuint Semiconductor, Inc., Beaverton, Oreg.

[21] Appl. No.: 107,204

[22] Filed: Oct. 13, 1987

[51] Int. Cl.⁴ .......................................... H01R 23/72
[52] U.S. Cl. ..................................... 439/72; 439/331; 439/912
[58] Field of Search .................... 439/68-73, 439/259, 912, 330, 331; 324/158 F, 158 P, 72.5

[56] References Cited

U.S. PATENT DOCUMENTS

| | | | |
|---|---|---|---|
| 3,874,768 | 4/1975 | Cutchaw | 439/72 |
| 3,968,433 | 7/1976 | Dobarganes | 324/158 F |
| 4,397,519 | 8/1983 | Cooney | 324/158 P |
| 4,463,310 | 7/1984 | Whitley | 324/158 F |

FOREIGN PATENT DOCUMENTS 57-114866  7/1982  Japan ................. 324/158 F

OTHER PUBLICATIONS

Electronics, 10-9-1980, p. 44.
IBM Bulletin, Spencer, vol. 13, No. 5, p. 1235, 10-1970.

*Primary Examiner*—Neil Abrams
*Attorney, Agent, or Firm*—William S. Lovell; Jay K. Malkin; William K. Bucher

[57] ABSTRACT

A method for removably securing the leads of a semiconductor package to the conductive pathways on a circuit board is disclosed. Specifically, a retaining member is provided which includes a plurality of bores each sized to receive a pressure pin. Each pin communicates with a biasing system, enabling the resilient movement of each pin independently of the other pins. The retaining member and pins are positioned above the semiconductor package on the circuit board, and subsequently urged downward so that each pin contacts one of the leads on the package. As a result, the proper pressure is applied to each pin so that it effectively communicates with its designated conductive pathway on the circuit board.

13 Claims, 2 Drawing Sheets

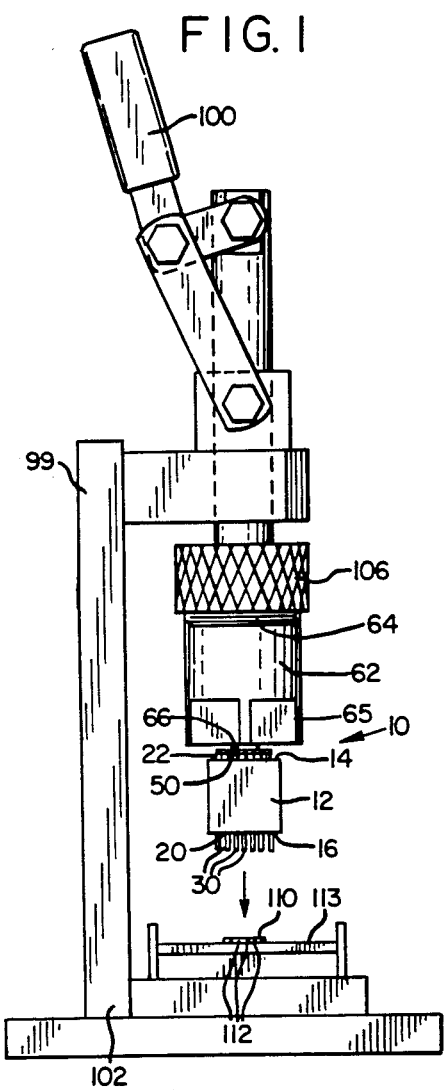
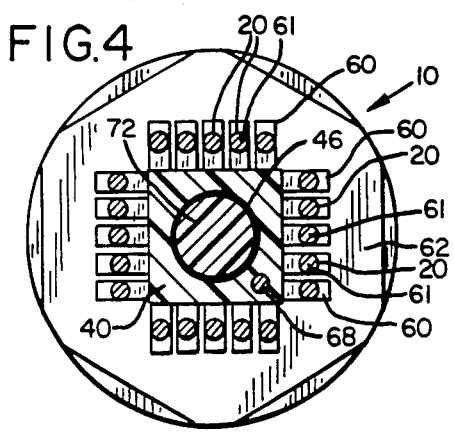
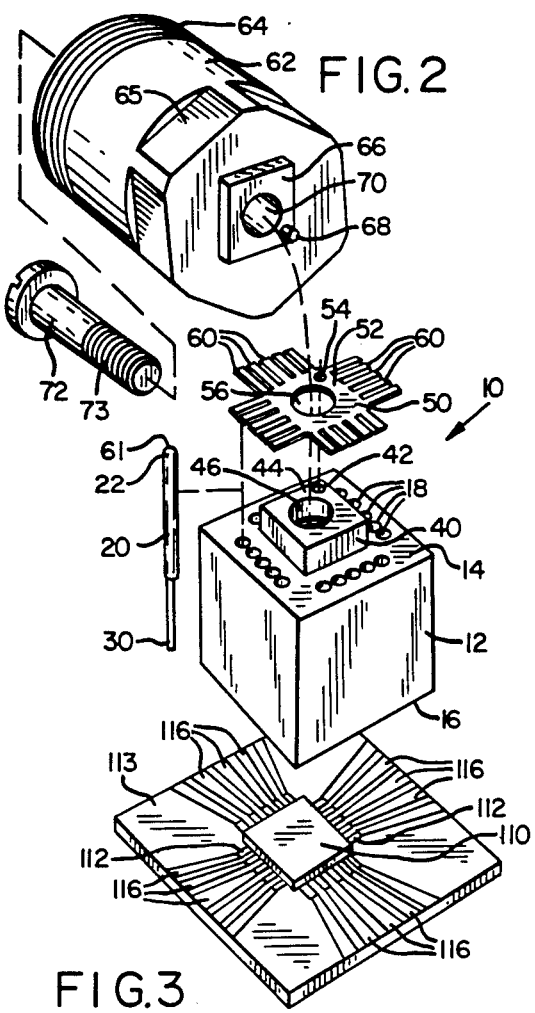
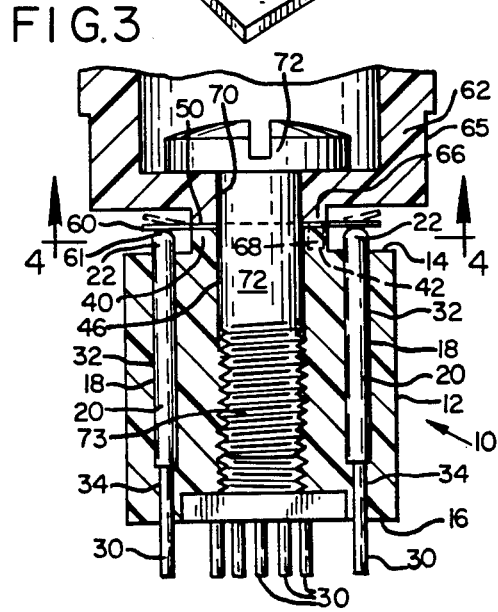

METHOD AND APPARATUS FOR REMOVABLY ATTACHING SEMICONDUCTOR PACKAGES TO CIRCUIT BOARDS

The present invention generally relates to a method and apparatus for removably securing a semiconductor package to a circuit board. More particularly, a method and apparatus is disclosed which involves the selective application of pressure on the leads of a semiconductor package when positioned on a circuit board so that sufficient contact can be made between the leads and conductive pathways on the board.

In order to test and evaluate packages containing semiconductor devices, it is important to temporarily attach the packages to an appropriate circuit board or test structure. The ability to repeatedly install and remove the packages with minimal effort is highly desirable. This is especially important in the temporary installation of microwave packages containing monolithic microwave integrated circuits in a controlled impedance environment for testing or evaluation. A controlled impedance environment for this purpose typically involves the use of planar transmission line structures known in the art and suitable for microwave applications.

Conventional attachment of semiconductor packages to a circuit board is accomplished by soldering. However, this method is impractical when repeated removal of the package is desired. Other methods have been developed in which the package is first mounted in position on a circuit board, followed by the application of pressure against the package leads in order to assure electrical contact between the leads and conductive pathways on the board. In accordance with this method, a pressure-exerting member constructed of a dielectric material is provided having a downwardly-extending portion sized to contact all of the leads on the package when the member is positioned against the package. The continued application of force on the pressure-exerting member causes the downwardly-extending portion to simultaneously push all of the leads against the conductive pathways on the circuit board at once.

However, the effectiveness of this method is limited by problems involving a lack of planarity or parallelism between the leads of the package, the conductive pathways on the circuit board, and the surface of the pressure-exerting member. If precise planarity or parallelism does not exist between these elements, the package leads will not properly communicate with the conductive pathways on the circuit board.

Planarity problems in the system described above are reduced by substantially increasing the pressure applied to the package leads. However, this technique often creates a variety of problems. Primarily, damage may be done to the pressure-exerting member and the package leads. In addition, the exertion of excess pressure may cause premature deterioration of the circuit board and its controlled impedance pathways. These problems result in poor system reliability, a high degree of maintenance and repair costs, and a decrease in testing/analysis efficiency.

The present invention involves a method and apparatus designed to control the problems described above. It incorporates a special arrangement of components which cooperate to eliminate parallelism problems, while applying the necessary amount of non-destructive pressure to assure sufficient electrical contact between the package leads and conductive pathways of the circuit board.

SUMMARY OF THE INVENTION

It is a main object of the present invention to provide a method and apparatus for removably attaching the leads of a semiconductor package to the conductive pathways of a circuit board which avoids problems associated with a lack of planarity between these components, and does not damage the package, circuit board or other parts of the system.

To accomplish this objective, a retaining member is provided which includes a plurality of bores. Inserted in each bore is a pin. The number of bores and pins used in the invention corresponds to the number of leads on the semiconductor package. Each pin has a first section extending through the bottom of the retaining member designed for engaging a package lead. Each pin also includes a second section communicating with a biasing system permitting bi-directional movement of the pin in the retaining member. This construction allows independent movement of each pin relative to the package lead with which it is associated.

The retaining member and pins are attached as a unit to an apparatus designed to move the unit downward and against a semiconductor package positioned on a circuit board. Downward movement of the unit against the package results in the individual application of pressure on each package lead by one of the pins. The downward pressure exerted by each pin is independently controlled by the biasing system associated therewith. As a result, planarity problems between the leads and the conductive pathways on the circuit board are effectively eliminated. Likewise, the application of excessive pressures against the package leads is not required.

These and other objects, features, and advantages of the invention will be more fully appreciated and understood from the following drawings and detailed description of preferred embodiments provided below.

BRIEF DESCRIPTION OF THE DRAWINGS

FIG. 1 is a side view of the retaining member and pins of the present invention mounted to a control apparatus for selectively moving the retaining member and pins downward against a semiconductor package.

FIG. 2 is an exploded perspective view of the components of the invention above a semiconductor package positioned on a circuit board.

FIG. 3 is a cross sectional view of the retaining member and associated components of the invention.

FIG. 4 is a sectional view taken along lines 4—4 of FIG. 3.

DETAILED DESCRIPTION OF PREFERRED EMBODIMENTS

Figure 5:
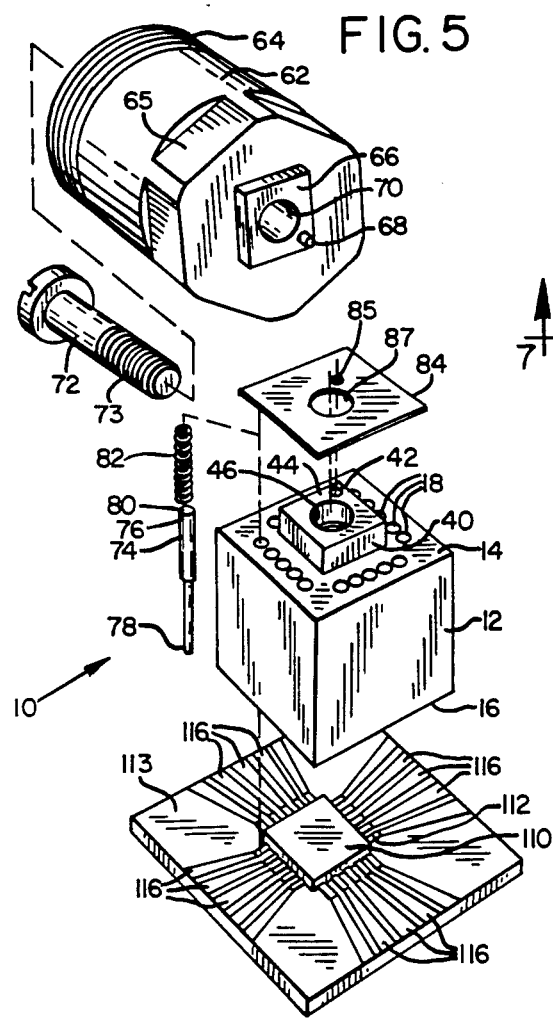
FIG. 5 is an exploded perspective view of the components of an alternative embodiment of the invention.

The present invention 10 involves an apparatus and method for applying the proper amount of pressure to each lead of a semiconductor package. The invention 10 is illustrated in FIGS. 1-3, and includes a retaining member or housing 12 having a top 14 and bottom 16. The housing 12 may be made of any suitable dielectric material, and is preferably manufactured of plastic. Usable plastics include those sold under the name Delrin ® (acetyl plastic) or Rexolite ® (acrylic plastic).

Extending downwardly through the housing 12 from top 14 to bottom 16 are multiple bores 18 (FIGS. 2 and 3). Positioned within each bore 18 is a pressure pin 20 having an upper section 22 and lower section 30. The upper sections 22 of each pin 20 extend outwardly through the top 14 of the housing 12. Likewise, the lower sections 30 extend outwardly through the bottom 16 of the housing 12. The pins 20 are mounted for slidable movement within the bores 18 of the housing 12. The number of pins 20 and bores 18 corresponds with the number of contact leads on the semiconductor package to be tested or evaluated.

With reference to FIG. 3, each bore 18 in the housing 12 has an upper portion 32 of a greater diameter than the upper section 22 of each pin 20. Likewise, each bore 18 also includes a lower portion 34 having a greater diameter than the lower section 30 of each pin 20. This construction allows free movement of the pins 20 within the bores 18.

In order to prevent pins 20 from falling out of the bores 18 in the housing 12, the diameter of the upper section 22 of each pin 20 is greater than the diameter of the lower portion 34 of each bore 18. Thus, the upper section 22 of each pin 20 cannot pass downwardly into the lower portion 34 of each bore 18. This prevents pins 20 from falling out of bores 18. However, the lower section 30 of each pin 20 extends downwardly beyond the bottom 16 of housing 12 to a distance sufficient to contact the leads of a package under test.

The pressure pins 20 are made of a low loss/low dielectric material in order to minimize any discontinuities or loading relative to the leads of the semiconductor package being evaluated. Suitable materials used to construct pins 20 include plastic (e.g. Delrin ® and Rexolite ®), ceramic or glass. The pins 20 may also be constructed of two components. For example, the upper section 22 may be manufactured of metal (e.g. aluminum, copper or brass) and the lower section 30 may be manufactured of ceramic or glass. The type of materials used to construct pins 20 depends on material availability, costs, and the use for which the invention 10 is intended.

With continued reference to FIGS. 2 and 3, the top 14 of the housing 12 includes a raised portion 40 having an opening 42 in corner 44. Passing through the center of raised portion 40 and through the longitudinal axis of the housing 12 from top 14 to bottom 16 is an enlarged internally threaded opening 46.

Positioned on top of the raised portion 40 is a planar leaf spring 50 having a central region 52, and an opening 54 of the same diameter as the opening 42 in the raised portion 40. Also included is an enlarged opening 56 of the same diameter as the opening 46 in the raised portion 40.

The leaf spring 50 is manufactured of a highly resilient material. In the present embodiment, a 5 mil. thick heat-treated beryllium copper spring is used.

Extending outward from the central region 52 of the leaf spring 50 is a plurality of individual legs 60 each being oriented directly over and in communication with the top 61 of the upper section 22 of each pin 20 (FIGS. 3 and 4). It is important that each leg 60 only contact one of the pins 20 as discussed below.

To secure the leaf spring 50 in place, a mounting member 62 is provided as shown in FIGS. 1-4. The mounting member 62 includes a threaded first end 64 and a second end 65 having a raised portion 66. The raised portion 66 includes an alignment pin 68 sized for passage through the opening 54 in the leaf spring 50 and opening 42 in the raised portion 40 of the housing 12. Alignment pin 68 enables the proper orientation of mounting member 62, leaf spring 50, and housing 12 relative to each other. The raised portion 66 of the mounting member 62 also includes a central bore 70 sized for receipt and passage of a mounting screw 72 having a threaded end 73 (FIG. 2).

To assemble the components of the invention 10, the pins 20 are positioned in the bores 18, and the leaf spring 50 is placed on the raised portion 40 of the housing 12. Thereafter, the raised portion 66 of the mounting member 62 is positioned against the leaf spring 50 with the alignment pin 68 passing through openings 42, 54 of the housing 12 and leaf spring 50. Next, the mounting screw 72 is passed through bore 70 in the mounting member 62, and threaded into the opening 46 through the housing 12. The mounting screw 72 is then tightened and assembly of the unit is completed.

Figure 6:
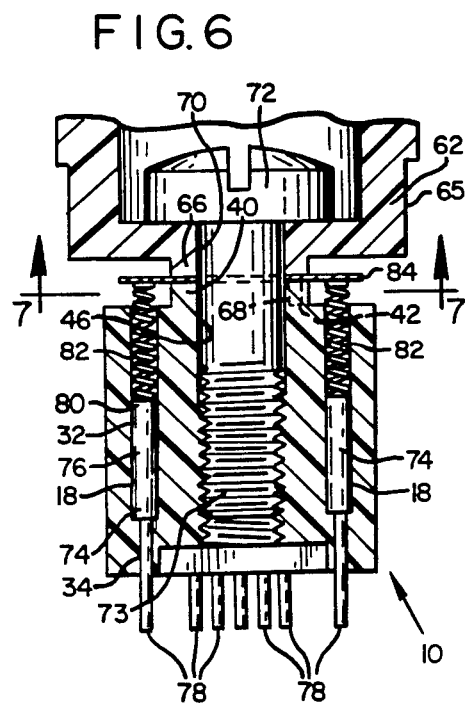
FIG. 6 is a cross sectional view of the embodiment of FIG. 5 showing the retaining member and associated components.
Figure 7:
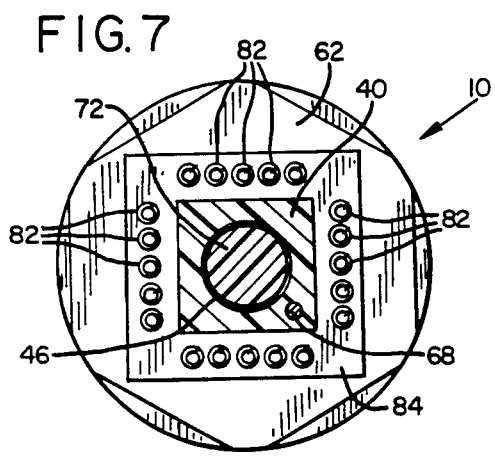
FIG. 7 sectional view taken along lines 7—7 of FIG. 6.

An alternative embodiment of the invention is shown in FIGS. 5-7. All of the components and structural materials in the embodiment of FIGS. 5-7 are the same as those used in the embodiment of FIGS. 1-4, except as indicated below.

Instead of pins 20, modified pins 74 are provided which are shorter in overall length than pins 20. Each pin 74 includes an upper section 76 and lower section 78. The upper section 76 of each pin 74 is entirely positioned within the housing 12 (FIG. 6).

Inserted in each bore 18 against the top 80 of each pin 74 is a coil spring 82. Instead of the leaf spring 50, a rigid, non-resilient member 84 preferably constructed of steel is used. The member 84 includes an opening 85 sized to receive the alignment pin 68 of the mounting member 62. Likewise, member 84 includes an enlarged opening 87 sized to receive screw 72.

The member 84 is inserted in the same position as leaf spring 50 of the first embodiment. Accordingly, the coil springs 82 are positioned between member 84 and pins 74 as shown in FIG. 6.

OPERATION

Operation of the invention 10 will first be discussed relative to the embodiment of FIGS. 1-4. The assembled structure including the mounting member 62, housing 12, pins 20 and other components is initially secured to an appropriate control apparatus 99 for moving the housing 12 and associated components in a downward direction (FIG. 1). The apparatus 99 includes a handle 100 and frame 102 Howevr, the overall construction of apparatus 99 may be varied, depending on the environment in which the invention 10 is used.

The end 64 of the mounting member 62 is threaded into a mounting ring 106 secured to the frame 102 of the control apparatus 99. Positioned at the bottom of the frame 102 is a semiconductor package 110 with a plurality of outwardly extending leads 112. The package 110 is placed on an appropriate circuit board 113 having a plurality of conductive pathways 116 (FIG. 2).

In operation, the handle 100 of the control apparatus 99 is moved so that the housing 12 and pins 20 travel downward toward the package 110. Continued downward movement results in engagement of the lower section 30 of each pin 20 with one of the leads 112 on the package 110. This engagement occurs independently with respect to each pin 20 and its associated lead 112.

When engagement occurs, pins 20 and legs 60 of the leaf spring 50 are initially urged upward. Movement of the legs 60 is shown in dashed lines in FIG. 3. However, the legs 60 thereafter prevent the continued upward movement of pins 20, and exert a counteracting downward force on the pins 20. This permits the individual application of pressure by each pin 20 on its respective lead 112 so that proper contact can be made with the conductive pathways 116 on the circuit board 113.

In the second embodiment of the invention (FIGS. 5-7) the same basic process occurs. However, the pressure exerted by each pin 74 against its respective lead 112 is provided through the action of coil springs 82 and non-resilient member 84 which function in the same manner as leaf spring 50 of the first embodiment.

The present invention thus enables the precise amount of pressure to be independently applied on each lead of a semiconductor package. The independent application of pressure on each lead is especially important, since variations in planarity will occur from one lead to another relative to the conductive pathways on the circuit board. Such variations cannot be successfully controlled using conventional pressure application systems.

Having herein described preferred embodiments of the present invention, it is contemplated that the invention shall include other modifications known to those skilled in the art. Accordingly, the present inventon shall only be construed in accordance with the following claims:

What is claimed is:

1. An apparatus for removably attaching the leads of a semiconductor package to the conductive pathways on a circuit board comprising:
    a retaining member having a top, a bottom, and a plurality of bores extending therethrough from said top to said bottom;
    a plurality of pressure pins each positioned within a different one of said bores, each pin comprising an upper section extending outwardly through the top of said retaining member, and a lower section extending outwardly through the bottom of said retaining member for engaging one of said leads of said semiconductor package; and
    biasing means comprising a planar resilient member fixedly positioned adjacent said top of said retaining member and having a center portion, and a plurality of legs extending outward from said center portion, each leg being posiitioned adjacent and above said upper section of a corresponding one of said pins and communicating with said upper section of each pin for urging said pin in a downward direction independently of said other pins when said pin engages a lead of said semiconductor package.

2. The apparatus of claim 1 wherein said upper section of each pin has a larger diameter than said lower section.

3. The apparatus of claim 1 wherein each pin is comprised of a low dielectric material selected from the group consisting of plastic, ceramic and glass.

4. The apparatus of claim 1 wherein said upper section of each pin is comprised of a different material than said lower section.

5. The apparatus of claim 4 wherein said upper section of each pin is comprised of metal, and said lower section is comprised of a low dielectric material selected from the group consisting of plastic, ceramic and glass.

6. The apparatus of claim 1 wherein said retaining member is comprised of plastic.

7. The apparatus of claim 1 wherein said planar resilient member comprises a beryllium copper alloy.

8. The apparatus of claim 1 wherein said bores of said retaining member each comprise means for preventing the removal of said pins therefrom.

9. The apparatus of claim 1 wherein each bore has an upper portion and a lower portion, said lower portion having a smaller diameter than said upper portion, said lower portion also having a smaller diameter than said upper section of each pin so as to prevent the removal of said pin through said bottom of said retaining member.

10. The apparatus of claim 1 wherein said retaining member comprises a threaded opening therethrough.

11. The apparatus of claim 10 wherein said apparatus further comprises means for moving said retaining member downward toward and against said semiconductor package.

12. The apparatus of claim 11 further comprising a connecting member having a bore therein sized for receipt of a mounting screw, said mounting screw being threaded into said threaded opening in said retaining member after passage thereof through said bore of said connecting member so as to attach said connecting member to said retaining member, said connecting member and attached retaining member being secured to said means for moving said retaining member downward toward and against said semiconductor package.

13. A method of removably attaching the leads of a semiconductor package to the conductive pathways on a circuit board comprising:
    providing a retaining member having a plurality of movable pins mounted therein and a biasing means having a planar resilient member fixedly positioned above said movable pins and having a center portion and a plurality of legs extending outward from said center portion, each leg being positioned adjacent and above a corresponding one of said movable pins;
    placing said semiconductor package on said circuit board with each lead thereof being positioned adjacent a conductive pathway on said circuit board; and
    moving said retaining member downward against said semiconductor package, each pin of said retaining member contacting one of said leads of said package and communicating with one of said legs of said biasing means for urging said pin in a downward direction independent of said other pins, thereby enabling the proper pressure to be applied to each lead so that complete electrical contact is made between each lead and the conductive pathway adjacent thereto.

* * * * *